June 30, 1964 H. C. SPIERLING 3,139,582

ADJUSTABLE LEVEL TRANSMITTER GAIN CONTROL

Filed Oct. 31, 1961

INVENTOR.
HERBERT C. SPIERLING
BY
Moody and Kintzinger
ATTORNEYS

3,139,582
ADJUSTABLE LEVEL TRANSMITTER GAIN CONTROL

Herbert C. Spierling, Marion, Iowa, assignor to Collins Radio Company, Cedar Rapids, Iowa, a corporation of Iowa Filed Oct. 31, 1961, Ser. No. 148,882
7 Claims. (Cl. 325—187)

Figures 1, 2:
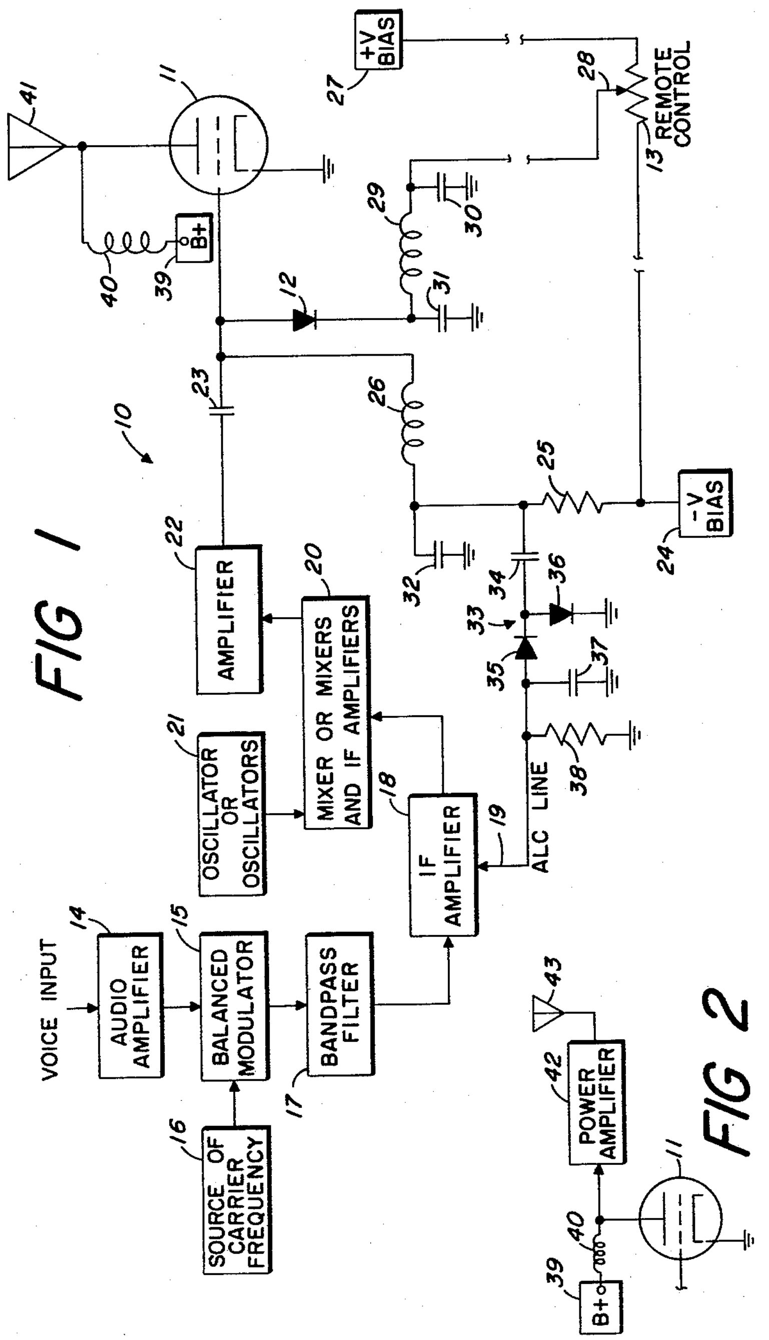

This invention relates in general to transmitter gain control, and in particular to an automatic load control which is adjustable from maximum power output, as determined by final amplifier grid current, down to zero power output.

Many automatic load control circuits used in transmitters are adapted for amplification gain control through voltage bias developed with grid current flow. With an automatic load control device, utilizing the grid current type of feedback, used in a transmitter, peak power limiting is sacrificed when the transmitter is operated on reduced peak power. This also requires stringent control of the audio input to maintain the reduced peak power output at the desired level. These circuits have not continued to provide automatic load control as power output is materially reduced because the modulation peak voltage levels are no longer giving grid current flow. Something more is needed for maintaining an automatic load control compression throughout a power reduction.

It is, therefore, a principal object of this invention to provide for the reduction of the peak power output of a transmitter while continuously maintaining automatic load control.

Another object is to provide a variable threshold automatic load control for transmitter amplifiers also employing power amplifier grid current type automatic load control circuitry.

A further object is to provide for limiting power peaks of a power amplifier, not having automatic load control, by use of a transmitter, having an adjustable threshold automatic load control, as an exciter or driver for the power amplifier.

This is particularly useful where the drive required for the power amplifier is less than the rated peak envelope power of the transmitter, and a means of limiting the peaks is desired.

A feature of this invention useful in accomplishing the above objects is a diode which is connected to the power amplifier grid and to an adjustable voltage biasing means. This voltage biasing means may be a variable potentiometer with one end connected to a minus bias voltage source, the other end connected to a relatively positive voltage source, and the variable tap connected to the diode. An R.F. filter network in the line connecting the variable tap and the diode permits the potentiometer to be mounted on a front panel away from the R.F. circuitry. Thus, positioning the tap of the variable potentiometer, as desired, is a convenient means for adjusting the automatic load control threshold anywhere from substantially zero power output to a maximum power output (assuming the maximum is determined by the power amplifier grid current threshold).

A specific embodiment representing what is presently regarded as the best mode of carrying out the invention is illustrated in the accompanying drawings:

In the drawings:

FIGURE 1 represents an R.F. transmitter equipped with automatic load control circuitry which may be actuated by power amplifier grid current flow, and a diode circuit having a remote control voltage bias adjustment for automatic load control threshold adjustment; and FIGURE 2, a fragmentary view showing the power amplifier output tube of the transmitter of FIGURE 1 providing an output to a power amplifier which, in turn, feeds an output signal to an antenna.

Referring to the drawings:

The radio frequency transmitter of FIGURE 1, generally indicated by the number 10, is equipped with an automatic load control (ALC) system which may be operated in a conventional manner by grid current flow in power amplifier 11. The amplifier is also provided with an ALC circuit having a diode 12 and a voltage bias adjustment potentiometer 13 for automatic load threshold adjustment from substantially zero power output to a maximum power output (assuming the maximum is that determined by power amplifier grid current threshold).

More specifically, an originating audio signal to be transmitted, which may be a voice input, is amplified by audio amplifier 14. The audio signal is then heterodyned in balanced modulator 15 (any conventional modulator could be used) with a carrier frequency from a source 16. The output, as a transmitter drive voltage, from modulator 15 is fed through band pass filter 17 to I.F. amplifier 18. I.F. amplifier 18 is subject to gain control by negative automatic load control voltages that may be applied through line 19.

The output from the I.F. amplifier may be applied to a mixer or mixers, and additional I.F. amplifiers indicated generally by block 20. The mixer or mixers of block 20 are fed an additional frequency input or inputs, as the case may be, from oscillator or oscillators indicated generally by block 21. The ultimate output from block 20 is fed to amplifier 22 from which the output is coupled through capacitor 23 to the grid of power amplifier 11.

The power amplifier 11 may be a conventional type operable as a class $A_1$, $AB_1$, or $B_1$ amplifier. Bias, for example, minus 60 volts, for power amplifier 11 is supplied by constant negative voltage supply 24. This negative bias voltage is applied to the grid of power amplifier 11 serially through resistor 25 and a coil 26 which acts as an R.F. choke.

One end of potentiometer 13 is connected to negative voltage supply 24 and the other end is connected to a positive voltage supply 27 supplying, for example, a +10 volt bias. Potentiometer 13 may be a control, at the front panel of the transmitter, having an adjustable tap 28 which is connected through coil 29 to the cathode of diode 12. Coil 29 and a capacitor 30, connected between one end of the coil 29 and ground, form an R.F. filter network permitting potentiometer 13 to be remotely mounted on the front panel away from the R.F. circuitry. The capacitor 31 at the other end of coil 29 is connected between the cathode of diode 12 and ground to provide a lower impedance to both R.F. and the detected signal envelope in order that the diode will see a low impedance on its cathode but permit application of back bias as determined by the setting of the adjustable tap 28 of potentiometer 13.

A capacitor 32 provides a shunt from the junction of resistor 25 and coil 26 to ground for stray R.F. The junction of resistor 25 and coil 26 is also connected to ALC line 19 through a negative voltage doubler circuit 33. The voltage doubler includes capacitor 34, diode 35, and diode 36. The anode of diode 35 is connected to ALC line 19 and the cathode is connected to capacitor 34. The anode of diode 36 is connected to the junction of diode 35 and capacitor 34 and the cathode is connected to ground. The ALC line 19 is connected through capacitor 37 to ground, and also through resistor 38 to ground. This provides a fast-attack-slow-discharge R.C. network for controlling the output of the voltage doubler being applied through ALC line 19 for controlling the gain of I.F. amplifier 18.

The plate of power amplifier 11 is positively biased by, for example, B+ voltage from voltage supply 39 through coil 40 which blocks R.F. The output from power amplifier 11 is fed to transmitting antenna 41. It may, however, be fed as the input to a straight linear power amplifier 42 as shown in FIGURE 2. This straight linear power amplifier 42, which would probably be operated for maximum undistorted power output, would provide an output for transmission from transmitting antenna 43.

In operation, the ALC system of transmitter 10 is activated for controlling the gain of the transmitter whenever grid current flow is developed, or for that matter, whenever current commences to flow through diode 12. Of course, the back bias of diode 12 may be so adjusted by moving the tap 28 of potentiometer 13 toward the plus voltage side that ALC is activated strictly by grid current flow.

However, when adjustable tap 28 is moved to a voltage level such that the back bias permits current flow through diode 12 at peak voltage levels insufficient for grid current flow, current flow through the diode circuit will activate ALC and control gain of the transmitter. Adjustment of tap 28, of remote control potentiometer 13, provides for adjustment from substantially zero power output to a maximum power output determined by power amplifier grid current threshold. Whenever the positive peaks of the signal being applied to the grid of power amplifier 11 are sufficiently high to give grid current flow, or current flow through the circuit of diode 12, current flow is also developed through resistor 25. As this occurs, the voltage potential change developed at the junction of resistor 25 and coil 26 consistent with the development of current flow through the resistor 25 is coupled through negative voltage doubler 33 to the ALC line 19 in a conventional manner.

The adjustable threshold ALC controlling diode 12, potentiometer 13 circuit has been installed in a 2–30 mc. transceiver. Prior to installation of the diode and remote control circuit, a standard two-tone audio test signal was applied to the transceiver and the output noted. An oscilloscope revealed a waveform of negligible distortion at rated power output (100 watts) while the transmitter was in about 10 db ALC compression. The adjustable threshold ALC circuit was then installed with one end of potentiometer 13 connected to a +10 volt voltage source and the other end connected to the minus voltage bias source. Tap 28 was moved toward the +10 volt end of potentiometer 13 and positioned to provide sufficient back bias on diode 12 to insure that ALC be activated strictly by grid current flow. The same test conditions set forth above were again observed and the output was found to have negligible distortion at rated power output and at 10 db ALC compression. As the arm of the potentiometer was moved toward the minus voltage bias connection the power output was steadily reduced to substantially 0 watts output, and if the audio gain control was reduced simultaneously to maintain the 10 db ALC compression, the distortion remained negligible through the power reduction.

If maintenance of a constant ALC compression is not critical, the power output may still be steadily reduced by moving the arm of the potentiometer toward the minus voltage bias connection without simultaneously reducing the audio gain control. Of course, as the current flow threshold of diode 12 is steadily reduced in this manner without simultaneously reducing the audio gain control, ALC compression will be steadily increased.

Thus, the added diode 12 and remote control potentiometer 13 provide the means for adjusting power output of a transmitter from substantially zero power output up to a maximum determined by the threshold level of grid current in the linear output tube (power amplifier 11). The ALC feature, which would otherwise have been lost if the transmitter power output had been reduced solely by lowering the audio input level, is maintainable throughout the range of this ALC threshold adjustment. In other words, the transmitter power output can be reduced to any power level below maximum and still maintain the 10 db additional talk power without exceeding the desired power output.

Components used with the installation in an amateur 2–30 mc. transceiver include the following:

| | | |
|---|---|---|
| Diode 12 | | 1N198 |
| Adjustable potentiometer 13 | ohms | 50K |
| Resistor 25 | do | 18K |
| Coil 26 | mh | 1 |
| Coil 29 | mh | 1 |
| Capacitor 30 | μμf | 1,000 |
| Capacitor 31 | μf | 1 |
| Capacitor 32 | μμf | 1,000 |
| Capacitor 34 | μf | 0.1 |

Other components of the ALC system, in the transmitter used for the tests, are standard components as existed in the Collins Radio Company KWM-2 amateur 2–30 mc. transceiver at the time of the tests.

Thus, from the foregoing description it will be seen that an improved relatively inexpensive and highly versatile adjustable threshold ALC system for transmitters has been provided. It provides such as ALC threshold adjustment with a diode and adjustable potentiometer circuit that may be readily added to existing ALC circuits in transmitters. It also provides R.F. isolating circuitry for mounting the adjustable potentiometer for remote control from the front panel of a transmitter and still permit back voltage bias adjustment, as desired, for the ALC controlling diode.

Whereas this invention is here illustrated and described with respect to a specific embodiment thereof, it should be realized that various changes may be made without departing from the essential contribution to the art made by the teachings hereof.

I claim:

1. A radio transmitting system having a power amplifier, and automatic load control circuitry for controlling the gain of the transmitting system; said automatic load control circuitry including: a control element in said power amplifier, a resistor, a minus voltage bias source connected through said resistor to said control element, a diode having an anode and a cathode with the anode directly connected to said control element of the power amplifier, and an adjustable potentiometer having opposite ends and a movable tap with the ends connected to a minus voltage bias source and a relatively higher voltage potential reference, respectively, and with said movable tap connected to the cathode of said diode for providing adjustment of back bias voltage on said diode by adjustably positioning the movable tap of said potentiometer.

2. The radio transmitting system of claim 1, wherein a first capacitor is connected between the cathode of said diode and conductive means establishing a voltage potential reference for the transmitting system, and a radio frequency filter network connected between the cathode of said diode and the movable tap of said adjustable potentiometer, said radio frequency filter network including a coil and a second capacitor with the coil between said first capacitor and said second capacitor, and with the second capacitor connected between said coil and said conductive means establishing a voltage potential reference.

3. In an automatic load control system for a radio transmitter having a power amplifying output device with a control element, audio input and amplifying means, signal modulating means, I.F. amplifying means, an antenna, means for feeding the modulated and amplified signal of the transmitter to said control element of the power amplifying output device, means for applying the output of said power amplifying output device to said antenna, and amplifying gain control means; a minus voltage bias source connected through resistive means to the control element of said power amplifying output device, automatic load control signal rectifying and line means connected for applying gain control voltage to said amplifying gain control means in response to voltage drop developed across said resistive means, a potentiometer having an adjustably movable tap connected between two voltage reference means of different voltage potential, and a diode having an anode connected to said control element of the power amplifying output device and having its cathode connected to the adjustable tap of said potentiometer.

4. In an automatic load control system for a radio transmitter having a power amplifying output tube with at least a control grid connected to a voltage biasing source negative relative to ground, a cathode connected to ground, an output plate connected to a voltage biasing source positive relative to ground, and having audio signal input, modulating, and heterodyning means, signal amplifying means providing an output R.F. signal, gain control means in said signal amplifying means, and means for applying the output R.F. signal from said signal amplifying means to said control grid all interconnected for operation as a radio frequency transmitter; impedance means connected between said negative voltage biasing source and said control grid, means coupling said control grid to said gain control means for applying voltage potential change developed with current flow through said impedance means to said gain control means, a unidirectional current flow device connected for plus to minus current flow from the connection of said impedance means and, said control grid for developing voltage potential change through said impedance means with current flow through the unidirectional current flow device and said impedance means, and adjustable level voltage bias means connected to said unidirectional current flow device for adjustably controlling the back voltage bias applied to said device.

5. The automatic load control system for a radio transmitter of claim 4, wherein said impedance means includes, resistive means, and R.F. signal blocking means; and said means coupling said control grid to said gain control means being connected to the junction of said resistive means and said R.F. signal blocking means.

6. The automatic load control system for a radio transmitter of claim 5, wherein said unidirectional current flow device is connected, to ground through a first capacitor, to said adjustable level voltage bias means through a second R.F. signal blocking means, and to ground by another path through said second R.F. signal blocking means and a second capacitor.

7. The automatic load control system for a radio transmitter of claim 5, wherein said unidirectional current flow device is a diode having an anode connected to said control grid and a cathode connected to said adjustable level voltage bias means; said first and second R.F. signal blocking means are coils; and said adjustable level voltage bias means is a potentiometer having opposite ends connected to two different voltage potential reference sources and having a movable tap connected to the cathode of said diode through the coil comprising said second R.F. signal blocking means.

References Cited in the file of this patent

UNITED STATES PATENTS

| | | |
|---|---|---|
| 2,224,582 | Schnell | Dec. 10, 1940 |
| 3,013,148 | De Long et al. | Dec. 12, 1961 |